United States Patent [19]

Min

[11] Patent Number: 5,159,415
[45] Date of Patent: Oct. 27, 1992

[54] CMOS DYNAMIC RAM WITH DISCRETE SENSE AMPLIFIERS AND A COMMON SENSE AMPLIFIER AND A METHOD FOR THE MANUFACTURE THEREOF

[75] Inventor: Dong-Seon Min, Seoul, Rep. of Korea

[73] Assignee: Samsung Electronics Co., Ltd., Suwon, Rep. of Korea

[21] Appl. No.: 633,013

[22] Filed: Dec. 24, 1990

[30] Foreign Application Priority Data

Aug. 31, 1990 [KR] Rep. of Korea ............... 1990-13675

[51] Int. Cl.[5] .................... H01L 21/265; H01L 21/70
[52] U.S. Cl. .................................. 357/23.6; 437/48; 437/52
[58] Field of Search ............. 365/190, 205, 203, 207, 365/149; 357/23.5; 437/48–52

[56] References Cited

U.S. PATENT DOCUMENTS

| | | | |
|---|---|---|---|
| 4,404,660 | 9/1983 | Menachem | 365/193 |
| 4,584,672 | 4/1986 | Schutz et al. | 365/205 |
| 4,636,982 | 1/1987 | Takemae et al. | 365/230.03 |
| 4,733,374 | 3/1988 | Furuyama et al. | 365/205 |
| 4,799,197 | 1/1989 | Kodama et al. | 365/149 |
| 4,931,994 | 6/1990 | Matsui et al. | 365/190 |

*Primary Examiner*—Robert Kunemund
*Assistant Examiner*—Loc Q. Trinh
*Attorney, Agent, or Firm*—Robert E. Bushnell

[57] ABSTRACT

A method for making a sense amplifier capable of achieving high-speed sensing operation as well as incurring less influence from electrostatic capacitance of bit lines in a high-integration semiconductor memory (DRAM) device is disclosed. The DRAM device includes a plurality of word line pairs and bit line pairs, and a plurality of memory cell arrays with a plurality of memory cells, and further includes discrete sense amplifier circuits connected to each of the memory cell arrays, common sense amplifier circuits coupled between the discrete sense amplifiers, and separation circuits controlled by a given control signal and connected between the discrete sense amplifier circuits and common sense amplifier circuits.

11 Claims, 6 Drawing Sheets

CMOS DYNAMIC RAM WITH DISCRETE SENSE AMPLIFIERS AND A COMMON SENSE AMPLIFIER AND A METHOD FOR THE MANUFACTURE THEREOF

BACKGROUND OF THE INVENTION

The present invention relates to a semiconductor memory device and more particularly to a method for making in the semiconductor memory device a sense amplifier that senses and amplifies data stored in a memory cell.

In a semiconductor memory device, particularly a dynamic Random Access Memory device (hereinafter, referred to as DRAM), data stored in a memory cell selected by a row decoder is charged or discharged to a bit line connected to a drain of a cell transistor, and the information appearing in a form of voltage difference on the bit line is sensed and amplified by a sense amplifier connected in parallel to the bit line and read out of the DRAM. Then, in the memory cell that has been read out, an original data is charged or discharged to maintain a dynamic memory function.

However, as the integration of memory devices increase more and more and their operation speed goes extremely higher, an electrostatic capacitance of a memory cell is reduced more, and consequently the memory cell is burdened with a load caused by the electrostatic capacitance of the bit line. For those who are skilled in the art it will be easy to recognize that the electrostatic capacitance of the memory cell should be closer to that of the bit line for a faster sensing operation.

FIG. 1 is a block diagram of a DRAM including a sense amplifier construction according to a prior art, wherein there are a plurality of memory cell arrays, each of the memory cell arrays 20, 60, 65, 25 having its own equalizing circuits 10, 70, 75, 15 and sense amplifiers 30, 50, 55, 35, respectively. There are further included transfer circuits 40, 45 to connect or separate adjacent memory cell arrays between each of the sense amplifiers 30, 50, 55, 35 connected to each of the memory cell arrays 20, 60, 65, 25.; and row decoders 90, 91, 92, 93, each connected to a word line of each of the memory cell arrays 20, 60, 65, 25. Every two memory cell arrays 20, 60, 65, 25 share one of column decoders 80, 81, 83. In this configuration of the DRAM, an input/output lines, to which data through the sense amplifiers 30, 50, 55, 35 are finally transferred, is included in the column decoder 80.

In such construction of a DRAM, assuming the position of the column decoder 80 as a center, when the left-sided external cell array 20 is selected, data is transferred through a path including sequentially, the external cell array 20, the first sense amplifier 30, the transfer circuit 40, the second sense amplifier 50, the internal cell array 60 and the input/output lines, whereas when the left-sided internal cell array 60 is selected, data is transferred through a path including the internal cell array 60, a second sense amplifier 50 and the input/output lines.

FIG. 2 shows a detailed circuit connection between the left-sided equalizing circuits 10, 70, the transfer circuit 40, the sense amplifiers 30, 50, and the left-sided external and internal memory cell arrays 20, 60 and the input/output lines.

In the circuit diagram illustrated in FIG. 2, there are shown, from the left to the right, the first equalizing circuit 10 having transistors 12-14 that receive a first equalizing signal 11 through gates; the external memory cell array 20; the first sense amplifier circuit 30 having two PMOS transistors 32, 33 whose gates are cross-coupled with external bit lines 24, 24'; the first transfer circuit 40 which connects the external bit lines 24, 24' with internal bit lines 64, 64', having two NMOS transistors 42, 43 that are used for transfer and controlled by a given separation signal 41; the second sense amplifier 50 having two NMOS transistors 52, 53 whose gates are cross-coupled with the internal memory cell array 60; the second equalizing circuit 70 having an NMOS transistor 72 that receives a second equalizing signal 71 through a gate; and the second transfer circuit 45 which connects the internal bit lines 64, 64' with input/output lines 84, 85 respectively, having two NMOS transistors 82, 83 that are used for transfer and controlled by a given separation signal 81. An equalizing voltage 9 with level of ½ Vcc is applied to between the NMOS transistors 12 and 14 of the first equalizing circuit 10.

The operation of the aforementioned prior art sense amplifier shall be explained hereafter, by way of an example, in a case where the external memory cell array 20 is selected in the circuit illustrated in FIG. 2. Before data is read out from a memory cell in the external memory cell array 20 having an NMOS transistor 22 and a capacitor 23, the external bit lines 24, 24' together with other bit lines are precharged and equalized at the level of ½ Vcc. And then, when a first word line 21 is selected, electric charges charged in the capacitor 23 is charged or discharged to the external bit line 24 through the NMOS transistor 22. Before the word line 21 is selected, an external equalizing signal 11 and the first separation signal 41 of the first transfer circuit 40 is in disabled state.

Once data is sensed and sufficiently amplified at the external bit lines 24, 24', the first separation signal 41 applied to the first transfer circuit 40 reaches "high" state and the voltage amplified on the external bit lines 24, 24' is transferred to the internal bit lines 64, 64'. Next, the voltage transferred to the internal bit lines 64, 64' goes to the input/output lines 84, 85 through the transfer transistors 82, 83 of the second transfer circuit 45.

When the voltage on the external bit lines is transferred to the internal bit lines, data is recharged in the selected memory cell of the external memory cell array 20. As stated in the foregoing description, when the word line is selected and the charges are discharged from the memory cell to bit lines, a data voltage appearing on the corresponding bit lines, because the data voltage appears dependently upon an electrostatic capacitance of the bit lines, has to exceed the electrostatic capacitance of the bit lines so that the electric potential of the bit lines can be split at the equalizing level of ½ Vcc to enable sensing operation.

In the configuration of the prior art, however, it takes more time for the data voltage to overcome the electrostatic capacitance of the bit lines, which then has come to be relatively higher by a reduction of electrostatic capacitance of the memory cell, i.e., the reduction of capacitance of a capacitor in the memory cell due to high integration of the memory device. As consequence, access time in reading data slows down because sensing operation of the sense amplifier circuit is delayed.

SUMMARY OF THE INVENTION

It is therefore, an object of the invention to provide a method for making a sense amplifier capable of achieving high-speed sensing operation as well as incurring less influence from electrostatic capacitance of bit lines in a high-integration semiconductor memory device.

It is another object of the invention to provide a sensing method that can speed up access time in reading data in a semiconductor memory device.

To achieve foregoing objects and other advantages of the invention, a DRAM device having a plurality of word line pairs and bit line pairs, and a plurality of memory cell arrays with a plurality of memory cells, further includes discrete sense amplifier circuits connected to each of the memory cell arrays, common sense amplifier circuits coupled between the discrete sense amplifiers, and separation circuits controlled by a given control signal and connected between the discrete sense amplifier circuits and common sense amplifier circuits.

DETAILED DESCRIPTION OF THE INVENTION

Figure 1:
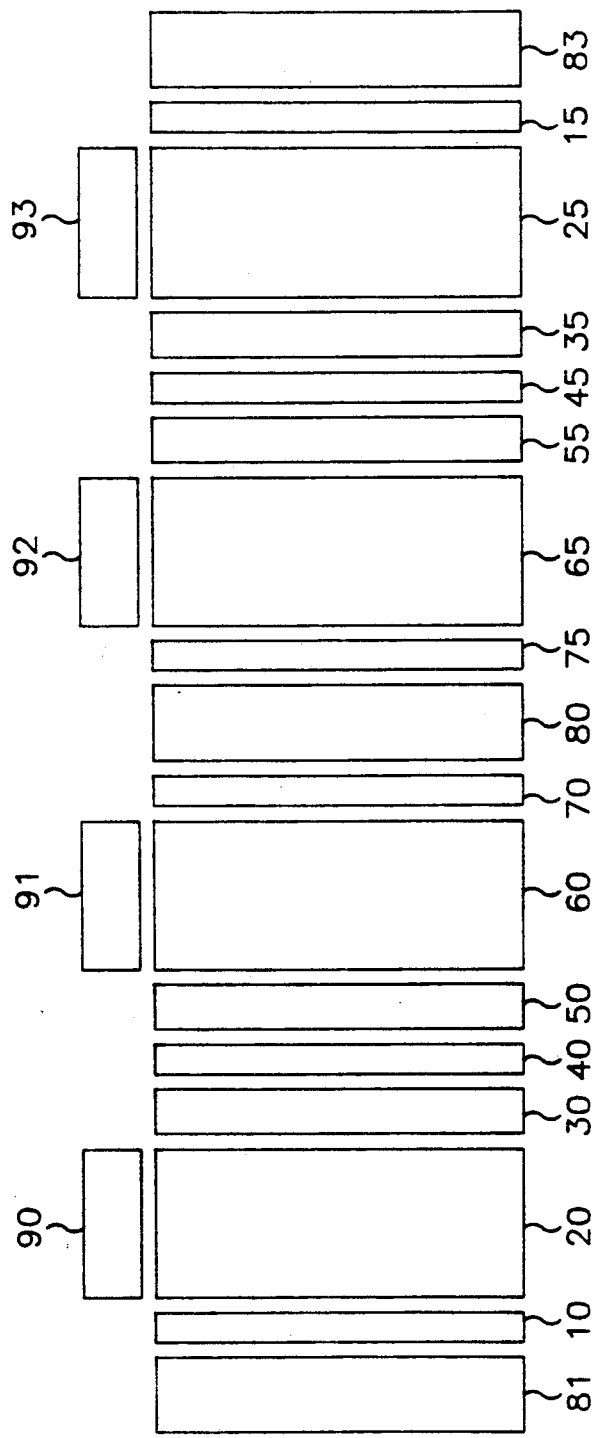
FIG. 1 is a block diagram of a DRAM including sense amplifiers according to a prior art.
Figure 2:
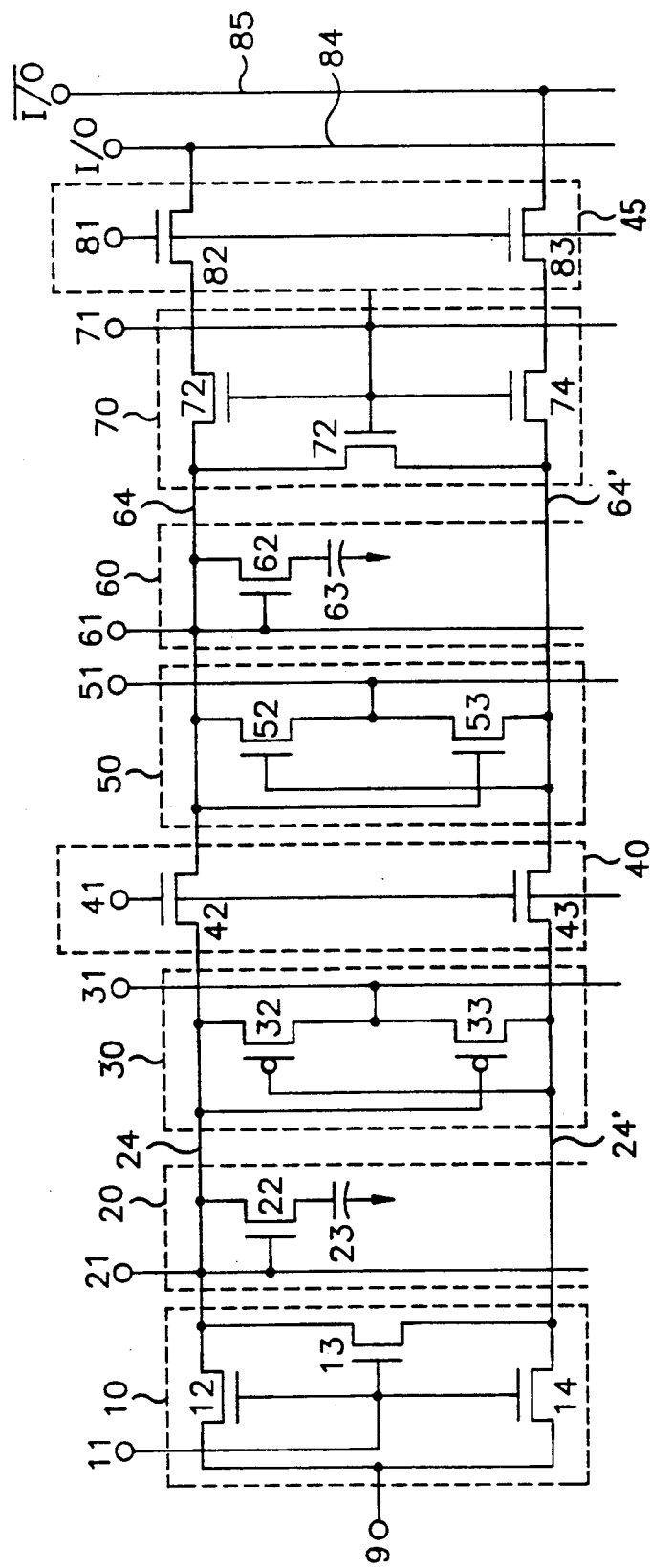
FIG. 2 is a detailed circuit diagram illustrating electrical connections between equalizing circuits 10, 70, a transfer circuit 40, sense amplifier circuits 30, 50 and memory cell arrays 20, 60 of FIG. 1.
Figure 3:
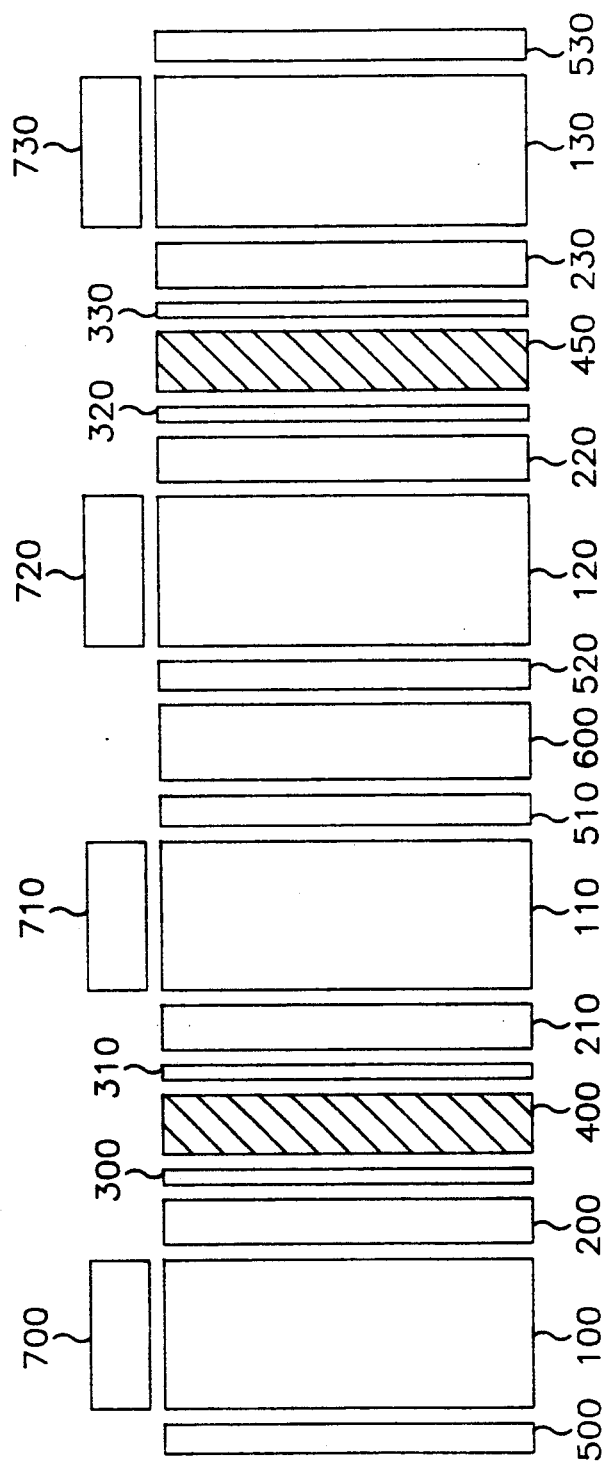
FIG. 3 is a block diagram of sense amplifier according to the present invention.

Hereinafter, the invention will be described further with reference to the attached drawings, by way of example. Referring to FIG. 3, there is shown a block diagram of a DRAM according to the present invention. Each of memory cell arrays 100,110, 120, 130 has respectively assigned equalizing circuits 500, 510, 520, 530, discrete sense amplifier circuits 200, 210, 220, 230 and row decoders 700, 710, 720, 730. A column decoder 600 is used for every four memory cell arrays. Common sense amplifier circuits 400, 450 connected with input/output lines, are disposed between the discrete sense amplifier circuits, and separation circuits 300, 310, 320, 330 are disposed between the discrete sense amplifier circuits and common sense amplifier circuits to connect or disconnect the sense amplifier circuits.

Thus, once the first memory cell array 100 is selected, a voltage difference appears on a bit line equalized by the first equalizing circuit 500, and this voltage difference is transferred to the input/output lines through the first discrete sense amplifier circuit 200, the first separation circuit 300 and the common sense amplifier circuit 400. On the contrary, once the second memory cell array 110 is selected, a voltage difference appears on a bit line equalized by the second equalizing circuit 510, and this voltage difference is transferred to the input/output lines through the second discrete sense amplifier circuit 210, the second separation circuit 310 and the common sense amplifier circuit 400.

Figure 4:
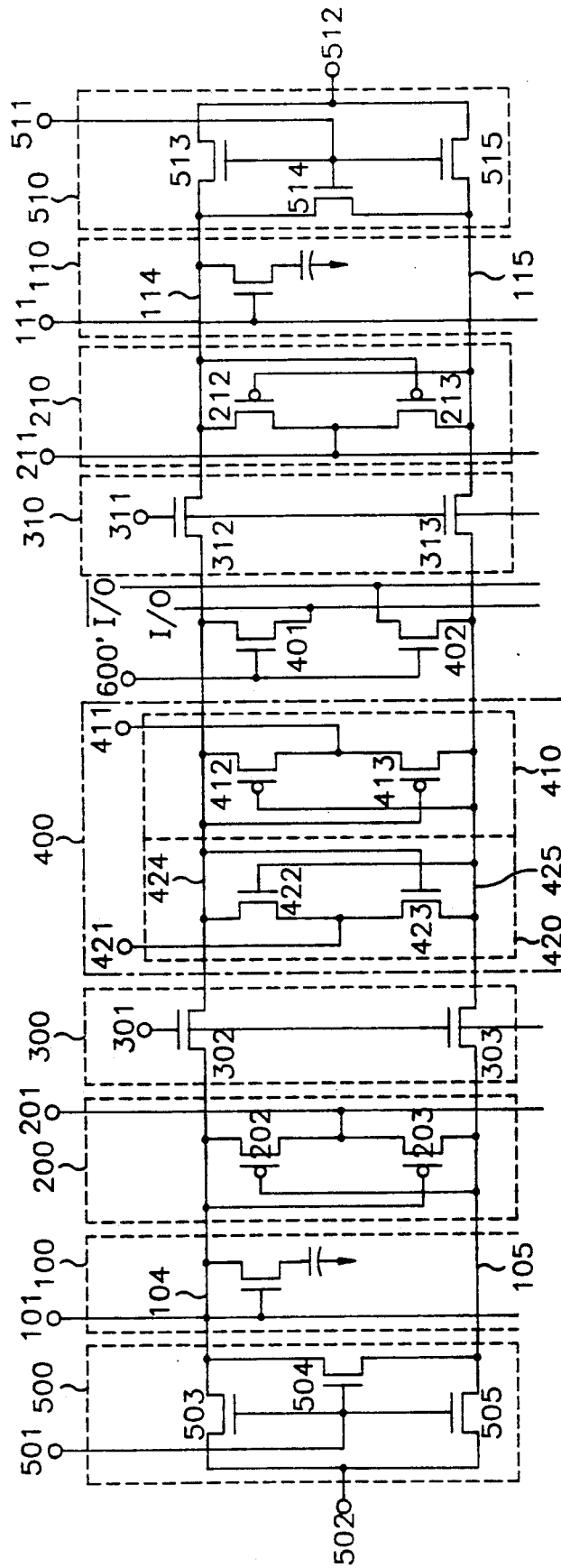
FIG. 4 is an embodiment of a detailed circuit diagram illustrating connections between equalizing circuits 500, 510, transfer circuits 300, 310, discrete sense amplifiers 200, 210, a common sense amplifier 400 and memory cell arrays 100,110.

FIG. 4 is a detailed circuit diagram illustrating internal circuits and their connections for the first and second memory cell arrays 100, 110, the first and second equalizing circuits 500, 510, the first and second discrete sense amplifier circuits 200, 210, the first and second separation circuits 300, 310 and the common sense amplifier circuit 400 in the FIG. 3.

The first equalizing circuit 500 is connected in parallel with a pair of first bit lines 104, 105 and has three NMOS transistors 503, 504, 505 whose gates are commonly connected with a first equalizing signal 501. The first memory cell array 100 is connected with a first word line 101. The first discrete sense amplifier circuit 200 has two PMOS transistors 202, 203 whose gates are cross coupled with a pair of the first bit lines 104, 105. The first separation circuit 300 has two NMOS transistors 301, 303 for separation that are connected between a pair of the first bit lines 104, 105 and a pair of common bit lines 424, 425 and are controlled by a first separation signal 301. The common sense-amplifier circuit 400 includes a P-type sense amplifier 410 and an N-type sense amplifier 420 whose gates are cross coupled with a pair of common bit lines 424, 425. Channels of NMOS transistors 401, 402 for input/output are connected between each ones of a pair of the common bit lines 424, 425 and input/output lines (I/O), their gates are commonly connected with a input/output control signal 600. The second separation circuit 310 has two NMOS transistors 312, 313 connected between a pair of the common bit lines 424,425 and a pair of second bit lines 114,115 respectively and controlled by a second separation signal 311. The second discrete sense amplifier circuit 210 has two PMOS transistors 212, 213 whose gates are cross-coupled with a pair of the second bit lines 114, 115 The second memory cell array 110 is connected with a second word line 111. The second equalizing circuit 510 has three NMOS transistors 513, 514, 515 whose gates are commonly connected with a second equalizing signal 511, is connected in parallel with a pair of the second bit lines 114, 115.

The first and second equalizing circuits 500, 510 have equalizing voltage source 502, 512 to which a given level of equalizing voltage (½ Vcc in the embodiment of the present invention) is applied, and a first and a second discrete sense signals 201, 211 are applied to nodes respectively that exist on each channel between PMOS transistors 202 and 203, 212 and 213 in the first and second discrete sense amplifier circuits 200, 210. And the P-type and N-type sense amplifiers 410, 420 of the common sense-amplifier 400 include a pair of PMOS transistors 412, 413 and a pair of NMOS transistors 422, 423 respectively, and first and second common sense signals 411, 421 are respectively applied to the nodes on each channel between the PMOS transistors 412, 413 and the NMOS transistors 422, 423.

Figure 5:
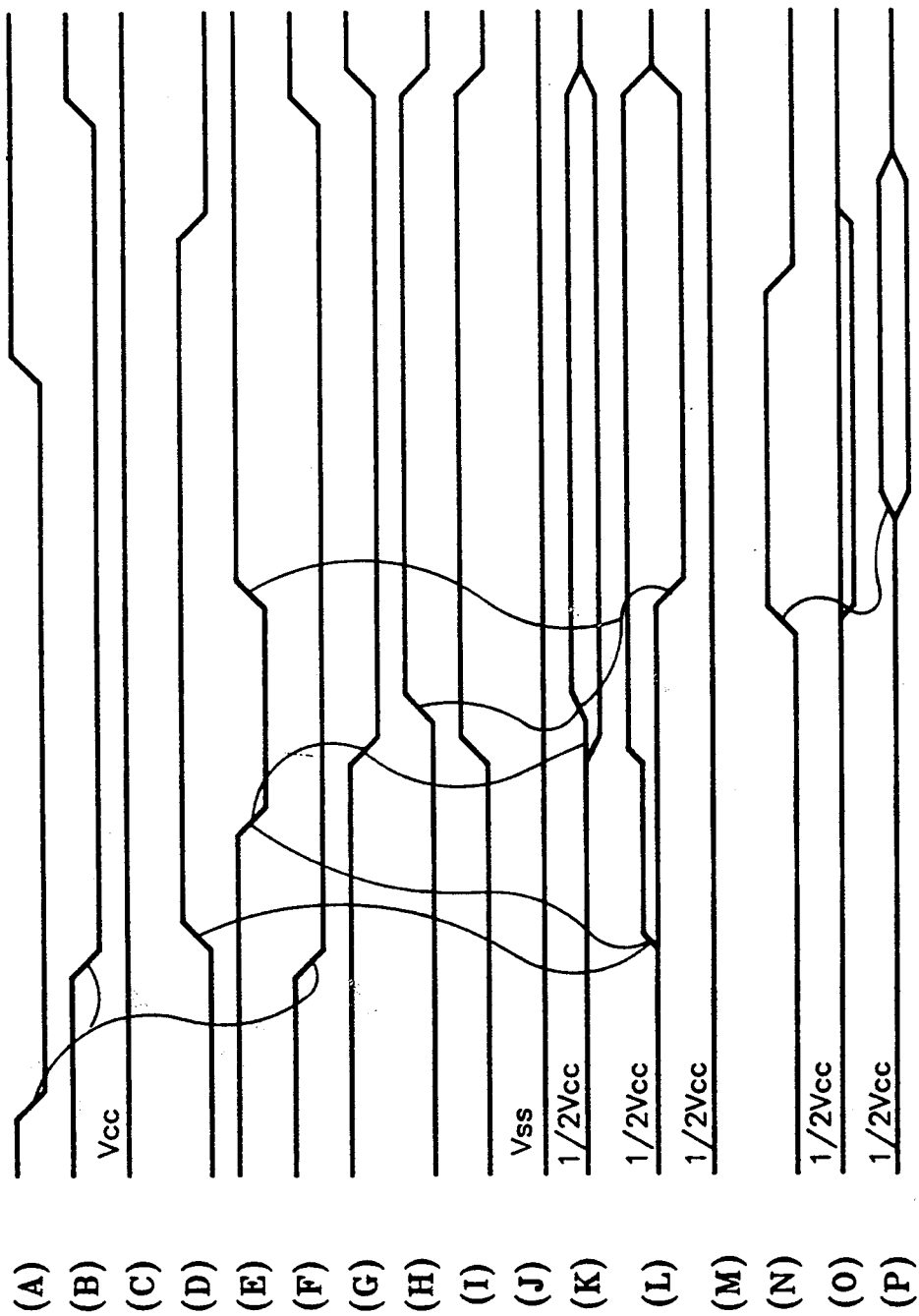
FIG. 5 is a timing diagram in case where the memory cell array 100 on the left is selected of FIG. 3.
Figure 6:
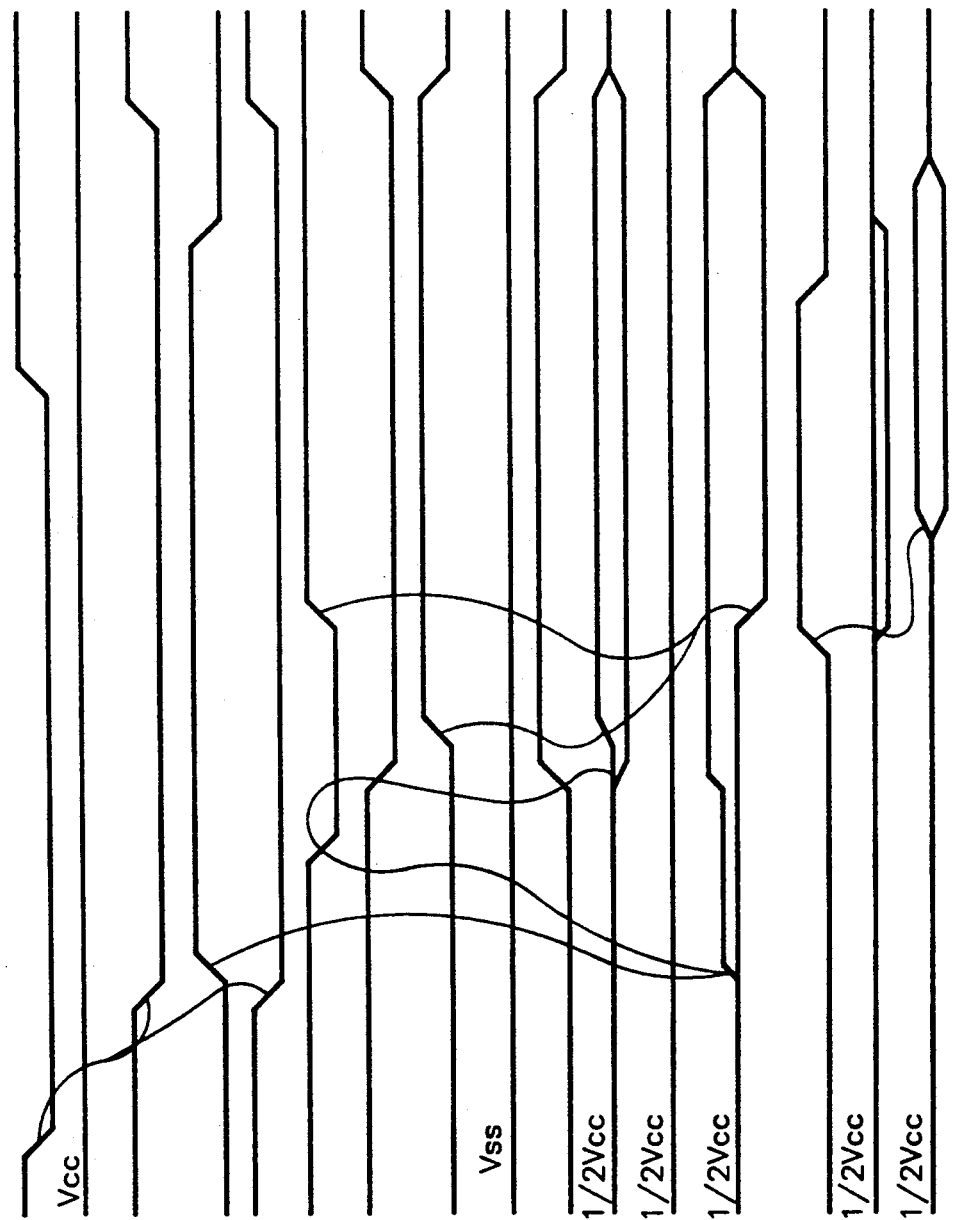
FIG. 6 is a timing diagram in case where the memory cell array 110 on the right is selected of FIG. 3.

FIG. 5 shows a timing diagram of the sensing operation in a case where the first memory cell array 100 is selected, and FIG. 6 shows a timing diagram of the a sensing operation where the second memory cell array 110 is selected. In common with both of FIG. 5 and FIG. 6, a waveform (A) represents a row-address strobe signal(RAS), (B) represents the first equalizing signal 501, (C) represents the second equalizing signal 511, (D) represents an electric potential of a selected word line, (E) represents the first separation signal 301, (F) represents the second separation signal 311, (G) represents the first common sense signal 411, (H) represents the second common sense signal 421, (I) represents the first discrete sense signal 201, (J) represents the second discrete sense signal 211, (K) represents an electric potential of a pair of the common bit lines 424,425, (L) represents an electrical potential of a pair of the first bit lines 104, 105, (M) represents an electric potential of a pair of the second bit lines 114, 115, (N) represents a column selection signal 600', and (O) and (P) represent input-/output lines (I/O) and output data, respectively.

When a row address strobe (RAS) signal is enabled by transformation of an external address, a row address signal is generated and by this row address signal, the second separation signal 311, (F), turns to "low" state so that a pair of the second bit lines 114, 115 and a pair of the common bit lines 424, 425 are isolated. At that time, a pair of the common bit lines 424, 425 and a pair of the first bit lines 104, 105 remains connected because the first separation signal 301, (E) continues to be in "high" state.

After the first equalizing signal 501, (B) turns to "low" state for a selection to be made within the first memory cell array 100 in a response to the row address signal, the first word line 101, (D) is selected. Since voltages of a pair of the first bit lines 104, 105, (L) are not in an equalized state, data stored in a selected memory cell in the first memory cell array 100 by the selected first word line 101, (D) appears on a pair of the first bit lines 104, 105, (L) with a form of a voltage difference.

Then, the first separation signal 301, (E), turns to "low" state and separates a pair of the first bit lines 104, 105 and a pair of the common bit lines, and subsequently the first common sense signal 411, (G), which is applied to the N-type sense amplifier 410 of the common sense amplifier circuit 400, is enabled so that the N-type sense amplifier 410 can perform the sense operation.

At the same time, the first discrete sense signal 201, (I), which is applied to the first discrete sense amplifier circuit 200 connected to a pair of the first bit lines 104, 105, is enabled and, independent of the N-type sense amplifier 410 of the common sense amplifier circuit 400, an operation for amplifying a sensed voltage is performed. Then, once the second common sense signal 421, (H) is enabled, the P-type sense amplifier 420 of the common sense amplifier circuit 400 is activated and a voltage on a pair of the common bit lines 424, 425, (K) is automatically amplified up to a sufficient level, and the sensed and amplified voltage is sent to the input-/output lines, (O), when the column selection signal 600', (N) turns to "high" state. Thereby, data, (P), read out from the selected first memory cell array 100, is provided through a given data output buffer (not shown herein). After the data, (P), is outputted, the first separation signal 301, (E), turns to "high" state and connects a pair of the common bit lines 424, 425 with a pair of the first bit lines 104, 105.

Then, the electric potential of a pair of the first bit lines 104, 105, connected with the memory cell that was initially selected from the first memory cell array 100, is equalized with the full Vcc level of a pair of the common bit line 424, 425. And because the equalized voltage can become a voltage to recharge the memory cell that was selected by the word line and discharged the voltage, the memory cell is restored to the full Vcc. When the row address strobe signal, (A), is disabled, the second separation signal 111 and the first equalizing signal 501, (B), is enabled together with the first separation signal 301, (E), that is enabled at "high" state, and therefore all the bit line pairs are equalized.

Next, in a similar manner, a case where a memory cell in the second memory cell array 110 is selected will be further described with reference to the timing diagram of FIG. 6. Once a row address strobe (RAS) signal, (A), is enabled by the transformation of an external address, a row address signal is generated and by this row address signal the second separation signal 301, (E), turns to "low" state so that a pair of the second bit lines and a pair of the common bit lines 424, 425 are separated. At that time, a pair of the common bit lines 424, 425 and a pair of the second bit lines 114, 115 remains connected because the second separation signal 311, (F), continues to be in "high" state.

After the second equalizing signal 511, (C), turns to "low" state for a selection to be made on the second memory cell array 110 in a response to the row address signal, the second word line 111, (D), is selected. Since voltages of a pair of the second bit lines 114, 115, (M) are not in an equalized state, data stored in a selected memory cell of the second memory cell array 110 by the second word line 111, (D) selected appears on a pair of the second bit lines 114, 115, (M) in a form of voltage difference.

The second separation signal 111, (F) turns to "low" state and separates a pair of the second bit lines 114, 115 and a pair of the common bit lines, and subsequently the first common sense signal 411, (G), which is applied to the N-type sense amplifier 410 of the common sense amplifier circuit 400, is enabled so that the N-type sense amplifier 410 can perform the sense operation. At the same time, the second discrete sense signal 211, (J), which is applied to the second discrete sense amplifier circuit 210 connected to a pair of the second bit lines 114, 115, is enabled and performs, independently upon the N-type sense amplifier 410 of the common sense amplifier circuit 400, an operation for amplifying a sensed voltage.

Then, when the second common sense signal 421, (H) is enabled, the P-type sense amplifier 420 of the common sense amplifier circuit 400 is activated and a voltage on a pair of the common bit lines 424, 425, (K) is automatically amplified up to a sufficient level, and the sensed and amplified voltage is sent to the input/output lines, (O) when the column selection signal 600', (N) turns to "high" state. As same as the case where the first memory cell array 100 was selected, after data (P) is outputted, the second separation signal 311, (F) turns to "high" state and connects a pair of the common bit lines 424, 425 with a pair of the second bit lines 114, 115. Then, the electric potential of a pair of the first lines 104, 105 connected with the memory cell that was initially selected from the first memory cell array 100, is equalized with the full Vcc level of a pair of the common bit line 424, 425.

Since the equalized voltage can become a voltage for recharging the memory cell that was selected by the word line and charged or discharged the voltage, the memory cell of the second memory cell array 110 is restored to the full Vcc. And then, once the row address strobe signal, (A), is disabled, the first separation signal 301, (E), and the second equalizing signal 511, (C), are enabled together with the second separation signal 311, (F), which is then enabled at "high" state, and therefore the bit line pairs are all equalized.

As described in the foregoing embodiment taken in the cases where two memory cell arrays get selected, the present invention has an effect that, when reading out data from a memory cell, it separates a voltage sensing operation, which performed by a discrete sense amplifier coupled with each memory cell, from a voltage amplifier operation, which performed by a common sense amplifier coupled with input/output lines, and after data is outputted, restores a sufficient source voltage level by connecting the discrete sense amplifier with the common sense amplifier, so as to thereby increase the speed of sensing and restoring operation in a DRAM.

In addition, the present invention has an advantage that sensing operation can be stabilized regardless a capacitance of a selected bit line, by putting each common sense amplifier, which amplifies a voltage difference and sends data to input/output lines, in between the two memory cell arrays, and separating the bit lines, which is connected with a selected memory cell, from the common sense amplifier for amplifying voltage for data output.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. In a method for fabricating a sense amplifier in a CMOS Dynamic Random Access Memory device (DRAM) having a plurality of word lines pairs and bit line pairs and a plurality of memory cell arrays with a plurality of memory cells, said method characterized in that each discrete sense amplifier circuit (200, 210) is connected with each of the bit line pairs of each of said memory cell arrays, a common sense amplifier circuit is connected between said discrete sense amplifier circuits, and separation circuits controlled by a given control signal are connected between said discrete sense amplifier circuits and said common sense amplifier circuit.

2. A method of fabricating a sense amplifier according to the claim 1, wherein said common sense amplifier circuit is connected with input/output lines of the DRAM.

3. A method of fabricating a sense amplifier according to the claim 1, wherein said separation circuits connect said discrete sense amplifier circuits with said common sense amplifier circuit after data is outputted through said input/output lines.

4. A method of fabricating a sense amplifier according to claim 1, wherein said discrete sense amplifier circuits and said common sense amplifier circuit operate independently upon each other circuit.

5. A CMOS dynamic random access memory device including a plurality of memory cell arrays with a plurality of memory cells, word line pairs and bit line pairs, said device comprising:

a plurality of equalizing circuits, each being connected to one side of corresponding ones of said plurality of memory cell arrays;
a plurality of discrete sense amplifiers connected to another side of said corresponding ones of said plurality of memory cell arrays;
a number of common sense amplifiers; and
a plurality of separation circuits connected to corresponding ones of said plurality of discrete sense amplifiers, wherein every two of said separation circuits is connected in common to one of said number of common sense amplifiers.

6. A device as claimed in claim 1 further comprising:
a plurality of row decoders corresponding to said plurality of memory cell arrays; and
a column decoder for controlling at least four of said memory cell arrays.

7. A device as claimed in claim 5, wherein said common sense amplifier comprises:
a N-type sense amplifier connected between a pair of common bit lines; and
a P-type sense amplifier connected between said pair of common bit lines.

8. A device as claimed in claim 7, wherein said N-type sense amplifier comprises:
a pair of NMOS transistors connected in series between said pair of common bit lines, wherein gates of said pair of NMOS transistors are cross coupled to said pair of common bit lines.

9. A device as claimed in claim 8, wherein said P-type sense amplifier comprises:
a pair of PMOS transistors connected in series between said pair of common bit lines, wherein gates of said pair of PMOS transistors are cross coupled to said pair of common bit lines.

10. A method for making a CMOS dynamic random access memory device including a plurality of memory cell arrays with a plurality of memory cells, word line pairs and bit line pairs, said method comprising the steps of:

connecting a plurality of equalizing circuit to one side of corresponding ones of said plurality of memory cell arrays;
connecting a plurality of discrete sense amplifiers to another side of said corresponding ones of said plurality of memory cell arrays;
connecting a plurality of separation circuits to corresponding ones of said plurality of discrete sense amplifiers; and
connecting a number of common sense amplifiers to said plurality of separation circuits, wherein one common sense amplifier is connected in common to two separation circuits.

11. The method as claimed in claim 10, further comprising the steps of:
connecting a plurality of row decoders corresponding to said plurality of memory cell arrays to said plurality of memory cell arrays; and
connecting a column decoder between a pair of said equalizing circuits for controlling at least four of said memory cell arrays.

* * * * *